United States Patent [19]

Pritchard

[11] 4,052,221

[45] Oct. 4, 1977

[54] ARTICLE MOUNTING ADHESIVE

[75] Inventor: Edwin J. Pritchard, Coopersburg, Pa.

[73] Assignee: Western Electric Co., Inc., New York, N.Y.

[21] Appl. No.: 683,151

[22] Filed: May 4, 1976

Related U.S. Application Data

[62] Division of Ser. No. 569,529, April 18, 1975, Pat. No. 3,970,494.

[51] Int. Cl.² ............................................. C08L 91/06
[52] U.S. Cl. .................................... 106/270; 106/271
[58] Field of Search ................. 106/270, 271, 15 AF, 106/15 FP; 260/28.5 R, 28.5 B

[56] References Cited

U.S. PATENT DOCUMENTS 2,028,716   1/1936   Delaney .......................... 106/15 AF

OTHER PUBLICATIONS

Kirk-Othmer, Encyclopedia of Chemical Technology, vol. 7, 1965, pp. 191, 198, 201 and 303.

Primary Examiner—Lorenzo B. Hayes
Assistant Examiner—Elizabeth A. Hatcher
Attorney, Agent, or Firm—R. Y. Peters

[57] ABSTRACT

A chlorinated naphthalene and a paraterphenyl are mixed to provide an adhesive for adhering a semiconductor wafer to a support for processing.

The adhesive so formed may be evaporated at the end of processing the wafer, without leaving a residue, to release the devices which have been formed from the wafer.

7 Claims, 4 Drawing Figures

ARTICLE MOUNTING ADHESIVE

This is a division of application Ser. No. 569,529 filed Apr. 18, 1975, now U.S. Pat. No. 3,970,494.

BACKGROUND OF THE INVENTION

1. Field of the Invention

The invention relates to a method for adhering one surface to another surface and, more particularly, to a method for mounting a semiconductor wafer on a support by means of a mixture comprising a chloronaphthalene and a terphenyl.

2. Description of the Prior Art

Semiconductor devices are formed in a wafer of semiconductor material and the wafer is mounted on a carrier or support by cementing it thereto with polypropylene or a wax, such as that solid by the Biwax Corporation under the trade designation "B-7050." The wafer is then thinned by lapping and etched into individual devices. This produces an array of hundreds of devices which have been formed as close together as possible in order to obtain the maximum number of devices from the semiconductor wafer.

The close-packed array contains both acceptable and unacceptable devices, and, for economy of further manufacturing operations, the acceptable devices are transferred from the support on which they were formed to another support in an expanded array. This may be done as disclosed in copending application, Ser. No. 307,898, filed Nov. 20, 1972 or No. 517,698, filed Oct. 24, 1974, which are assigned to the same assignee as this application.

As disclosed in application Ser. No. 517,698, the waxes used in the prior art polymerize and/or oxidize on prolonged heating at the elevated temperatures required for device removal. Such chemically changed wax is difficult to remove and it is essential that any such wax be removed to avoid contaminating the chips and interfering with subsequent bonding to circuit boards. Thus, prolonged heating at the elevated temperatures should be avoided in order to prevent polymerization and/or oxidation of the polypropylene or waxes.

Another way of avoiding the effects of prolonged heating is to use stable hydrocarbon compounds which will evaporate completely and at relatively low temperatures. M. L. White discloses, in U.S. Pat. No. 3,752,717, an adhesive consisting essentially of at least one of the following: fluorene, phenanthrene, anthracene, octadecane, eicosane, docosane, and tetracosane. These vaporize completely without leaving residues.

Further, improvement may be made over this prior art through the use of combinations of naphthalene and benzene compounds which adhere better and also vaporize leaving no residue.

SUMMARY OF THE INVENTION

Accordingly, the invention provides an improved method for adhering one surface to another surface and an adhesive therefor. The method comprises applying an adhesive comprised of at least one chloronaphthalene and at least one terphenyl to at least one of the surfaces to be adhered and contacting one surface with the other to join them together.

DESCRIPTION OF THE DRAWINGS

Other objects, advantages and features of the invention will be more readily understood from the following detailed description of specific embodiments thereof, when read in conjunction with the accompanying drawings in which.

DETAILED DESCRIPTION

Figure 1:
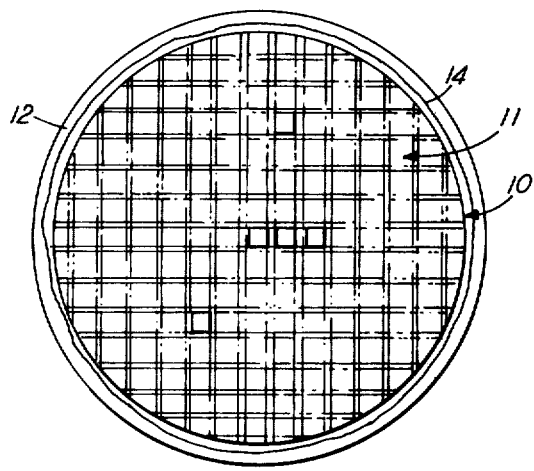
FIG. 1 is a plan view showing a silicon wafer mounted on a support.

Referring now to FIG. 1, a silicon wafer 10, containing an array of semiconductor devices 11 is mounted on a support 12 for further processing. The wafer 10 is cemented or adhered to the support 12 by means of a mixture 14 comprising a chlorinated naphthalene and a terphenyl.

The support 12, which may be any suitable material such as ceramic, glass, sapphire, or a barium ferrite, and the wafer 10 are heated to a suitable temperature using any conventional means, e.g., a hot plate or oven. The mixture 14 is placed on the support 12 after it has been heated. The amount is dependent on the size of the wafer 10 and its corresponding support 12. The wafer 10 may typically be two inches or larger in diameter and the support 12 somewhat larger than the wafer.

The mixtures may be applied either hot or cold, i.e., molten or solid. If applied in the solid form, a short time is required for it to liquefy.

The adhesive mixture 14 comprises at least one chloronaphthalene and at least one terphenyl. The chloronaphthalene and terphenyl selected, as well as the quantity of each, is dependent upon the particular application of the resultant adhesive mixture. A suitable adhesive mixture is one which has a sharp melting point and a low viscosity when heated a few degrees above the melting temperature. Of course, the melting point should be compatible with the materials being adhered as well as with the processes to which the adherent surfaces are destined to be subjected.

Chloronaphthalenes of particular interest for adhering a semiconductor wafer to a support are those having softening points from approximately 120° C to 180° C. Some typical suitable chloronaphthalenes are those sold by the Koppers Company, Inc. under the registered trademark "HALOWAX" and designated Halowax 1013, 1014 and 1051 which include tri, tetra, penta, hexa, septa and octachloronaphthalene. The composition of these waxes is about as follows:

| Mixture Designation | Halowax Designation | % of Total Chloronaphthalene by Weight | | | | | |
|---|---|---|---|---|---|---|---|
| | | tri | tetra | penta | hexa | septa | octa |
| A | 1013 | 10 | 50 | 40 | | | |
| B | 1014 | | 20 | 40 | 40 | | |
| C | 1031 | | | | | 10 | 90 |

The foregoing chloronaphthalenes are mixed with at least one terphenyl selected from meta, ortho, or para (m-, o- or p- respectively) terphenyls. However, p-terphenyl is preferred because it makes the mixture tackier. A particularly suitable mixture comprises p-terphenyl combined with mixture, such as mixture B, of tetra, penta and hexachloronaphthalenes.

Figure 3:
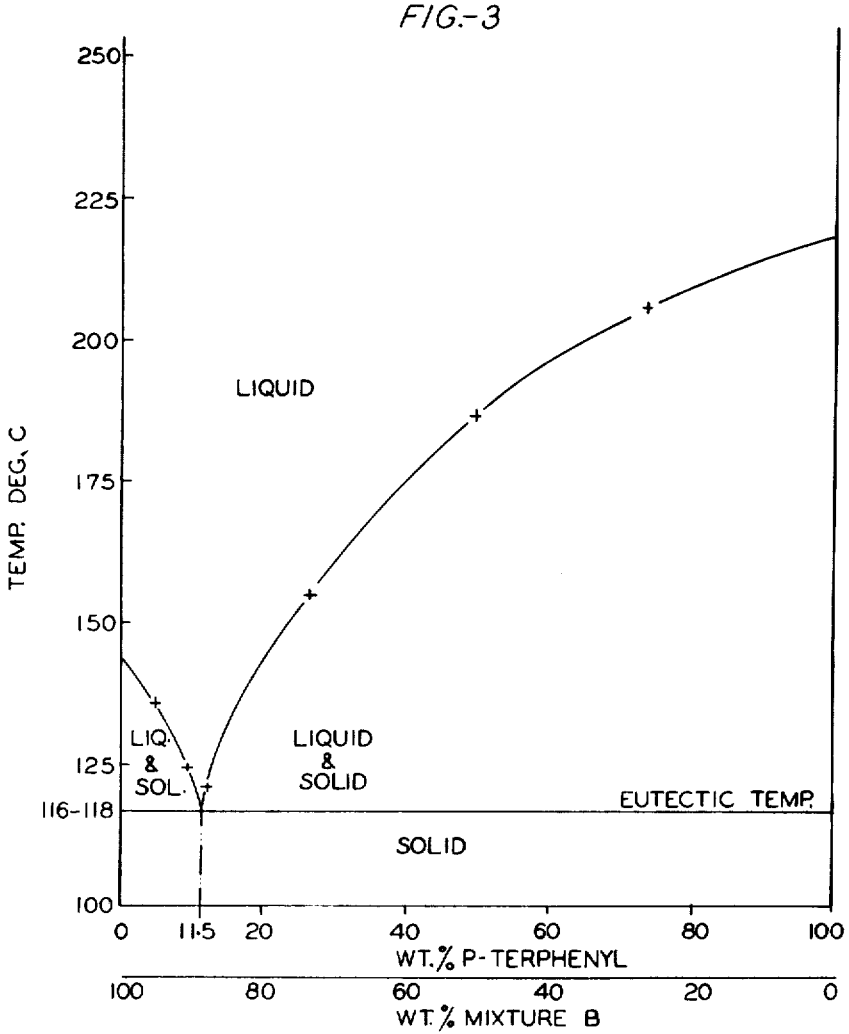
FIG. 3 is a graph showing the softening point of various mixtures of p-terphenyl and a mixture of chlorinated naphthalenes.

Referring now to FIG. 3, in which the ordinate of the chart is the softening point in degrees centigrade and the abscissa is the compositions of p-terphenyl and mixture B will be seen that the compositions acts very much like a binary alloy, e.g., of copper and silver. There is an eutectic composition at about 11 to 12% of p-terphenyl which turns abruptly from the solid state to liquid state at a temperature of about 116° to 118° C and this has been designated P-Wax. However, it is to be understood that mixtures in the range of 8-15% are suitable for the intended purpose.

These mixtures are advantageous for several important reasons. First, they retain their mechanical strength to a temperature very near their melting point. Second, when the mixtures are heated above their melting point, they become very low viscosity fluids which easily spread over the support 12 and permit air to be squeezed from beneath the wafer 10. Third, the mixtures are stable throughout the range of temperatures required for their use as an adhesive or cement to adhere the wafer 10 to the support 12. Fourth, when heated to 200° C or above, the mixtures evaporate completely without leaving a residue. Thus, the mixtures do not oxidize polymerize, or pyrolize as do most of the prior art adhesives or cements.

Once the mixture 14 has been applied to the support 12 and liquefied (if not applied as a liquid) the heated wafer 10 is pressed against the support 12. Preferably, the pressing is done in such a way as to force any trapped air from under the wafer. A weight may be used, if the wafer is slightly warped, to hold the wafer against the support until the mixture has solidified.

Figure 2:
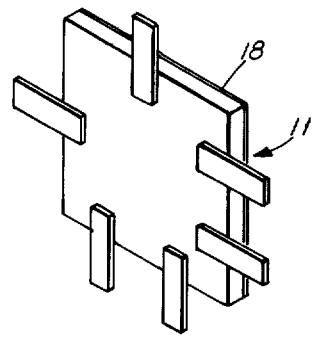
FIG. 2 is an isometric view of one of the devices into which the silicon wafer will ultimately be separated.
Figure 4:
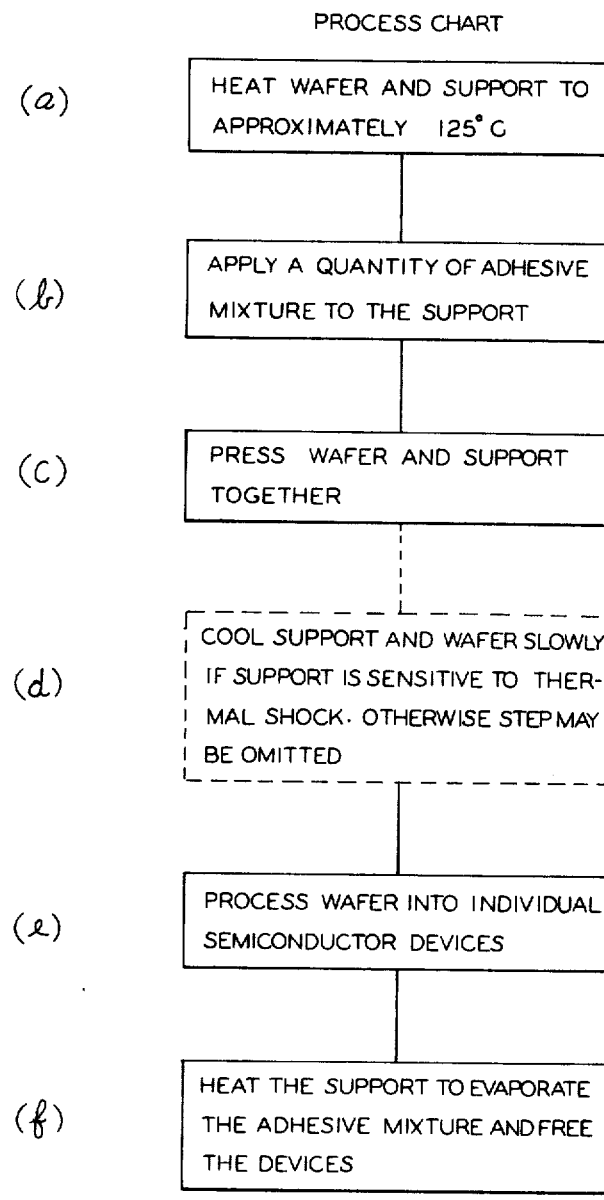
FIG. 4 is a process chart showing the handling steps using the chloronaphthalene-terphenyl mixtures.

In some cases, the support 12 is a ferrite magnet and the devices, such as the device 11 shown in FIG. 2, are coated with a magnetic coating 18 before the wafer 10 is separated into its individual devices. Thus, the devices 11 will be held on the magnetic support 12 after the mixture 14 has been removed. However, the magnetic support 12 is sensitive to thermal shock and, therefore, it must be cooled slowly. Reference is made to FIG. 4 which sets forth the steps of the inventive process and indicates, by means of the dashed step (d), that where the support is sensitive to thermal shock, as is the ferrite magnet, a slow cooling step is required. For example, the heated support 12 and wafer 10 may be set on a thermally insulating surface, such as an asbestos pad, and allowed to cool slowly in air.

When cooled, the wafer 10 on its support 12 is put through manufacturing operations, such as masking, etching, electrical test, etc.

After the manufacturing operations are completed, the mixture 14 is removed by heating the wafer 10 and support 12 to approximately 200° C for about 1 hour. This evaporates the mixture 14 which leaves no residue behind. Accordingly, no solvent cleaning is necessary.

EXAMPLE

Paraterphenyl, 11.5 percent by weight, was added to mixture B. This produced a new mixture, designated P-Wax, having eutectic characteristics and a melting range of about 116°-118° C. The P-Wax was very fluid at 120° C-125° C but was solid at room temperature and was cast into one-fourth inch diameter sticks.

Referring to FIG. 1, a barium ferrite support 12 and two inch diameter silicon wafer 10 about 0.015 inch thick were heated to approximately 125° C on a thermostatically controlled hot plate. A stick of the P-Wax was applied to and melted on the support 12. The melting of a 1/16 inch length of the stick of P-Wax provided a measured amount of the adhesive sufficient for the two inch diameter wafer.

The wafer 10 was then pressed against the support 12 and the assembly allowed to cool slowly on a cement-asbestos slab of thermal insulating material to solidify the P-Wax without fracturing the support. This adhered the wafer to the support and completed the mounting of the wafer.

Many wafers were mounted in this manner and processed through manufacturing operations such as grinding to a thickness of 0.002 inch, separation etching to form an array of individual devices 11, applying a magnetic coating, and testing to determine the good devices in the array. Finally, the devices 11 and supports 12 were heated to about 200° C for about 1 hour so that the P-Wax evaporated and no residue remained.

While there has been described and illustrated herein practical embodiments of the present invention, it is to be understood that various modifications and refinements which depart from the disclosed embodiments may be adopted without departing from the spirit and scope of the present invention.

What is claimed is:

1. An evaporable thermoplastic adhesive for mounting articles which comprises:
  a. at least one isomer of chlorinated naphthalene; and
  b. p-terphenyl.

2. The adhesive described in claim 1, which comprises: at least 8-15% by weight of p-terphenyl.

3. An evaporable adhesive mixture as described in claim 1 wherein the isomer of chlorinated naphthalene is selected from the group consisting of tri, tetra, penta, hexa, septa and octa chloronaphthalene and p-terphenyl.

4. An evaporable semiconductor wafer mounting adhesive which comprises:
  a. the tetra, penta, and hexa isomers of chloronaphthalene; and
  b. about 11.5% by weight of p-terphenyl.

5. A semiconductor wafer mounting adhesive as recited in claim 4, wherein the total chloronaphthalene comprises 20% tetra and 40% by weight each of penta and hexa chloronaphthalene.

6. A completely evaporable thermoplastic adhesive mixture which comprises, (1) a first component comprising 20, 40 and 40 percent, respectively, of tetra, penta and hexachloronaphthalenes and (2) a second component comprising p-terphenyl.

7. A wafer mounting adhesive as recited in claim 6, wherein the second component is in eutectic proportion of the first component.

* * * * *